US012433146B2

(12) United States Patent
Qin et al.

(10) Patent No.: US 12,433,146 B2
(45) Date of Patent: Sep. 30, 2025

(54) STRETCHABLE DISPLAY PANEL AND METHOD FOR MANUFACTURING STRETCHABLE DISPLAY PANEL

(71) Applicant: BOE Technology Group Co., Ltd., Beijing (CN)

(72) Inventors: Chengjie Qin, Beijing (CN); Fangxu Cao, Beijing (CN); Tao Wang, Beijing (CN); Tao Sun, Beijing (CN); Song Zhang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 264 days.

(21) Appl. No.: 17/429,609

(22) PCT Filed: Jan. 6, 2021

(86) PCT No.: PCT/CN2021/070524
§ 371 (c)(1),
(2) Date: Aug. 9, 2021

(87) PCT Pub. No.: WO2021/203786
PCT Pub. Date: Oct. 14, 2021

(65) Prior Publication Data
US 2023/0189627 A1    Jun. 15, 2023

(30) Foreign Application Priority Data
Apr. 9, 2020    (CN) .......................... 202010275063.3

(51) Int. Cl.
*H10K 77/10*    (2023.01)
*H10K 59/122*    (2023.01)
(Continued)

(52) U.S. Cl.
CPC ......... *H10K 77/111* (2023.02); *H10K 59/122* (2023.02); *H10K 59/873* (2023.02); *H10K 2102/311* (2023.02)

(58) Field of Classification Search
CPC .. H10K 77/111; H10K 59/122; H10K 59/873; H10K 2102/311
(Continued)

(56) References Cited

U.S. PATENT DOCUMENTS

| 2016/0198567 A1 | 7/2016 | Hong et al. |
| 2017/0003440 A1 | 1/2017 | Kim et al. |

(Continued)

FOREIGN PATENT DOCUMENTS

| CN | 105761619 A | 7/2016 |
| CN | 107394058 A | 11/2017 |

(Continued)

OTHER PUBLICATIONS

CN2020102750633 first office action.
CN2020102750633 second office action.
CN2020102750633 Notice of Rejection.

*Primary Examiner* — Xia L Cross
(74) *Attorney, Agent, or Firm* — IPro, PLLC

(57) ABSTRACT

The present disclosure provides a display panel, a display device and a method for manufacturing a display panel. The display panel includes: a base, wherein the base includes a plurality of island regions and at least one perforated region, and the perforated region has an opening that penetrate through the base; and pixel units disposed in the island regions and an elastic filling layer disposed in each of the at least one perforated region.

17 Claims, 6 Drawing Sheets

(51) Int. Cl.
  *H10K 59/80* (2023.01)
  *H10K 102/00* (2023.01)
(58) Field of Classification Search
  USPC .......................................................... 257/72
  See application file for complete search history.

(56) References Cited

U.S. PATENT DOCUMENTS

| | | | |
|---|---|---|---|
| 2018/0334740 A1 | 11/2018 | Ikenaga et al. | |
| 2019/0164995 A1* | 5/2019 | Lee | H10K 77/111 |
| 2020/0176520 A1* | 6/2020 | Kim | H10K 50/844 |
| 2020/0194725 A1 | 6/2020 | Qin et al. | |
| 2021/0249488 A1 | 8/2021 | Sung et al. | |
| 2021/0273194 A1 | 9/2021 | Xie et al. | |

FOREIGN PATENT DOCUMENTS

| | | |
|---|---|---|
| CN | 107710885 A | 2/2018 |
| CN | 108138303 A | 6/2018 |
| CN | 108183126 A | 6/2018 |
| CN | 109065760 A | 12/2018 |
| CN | 109273506 A | 1/2019 |
| CN | 109545801 A | 3/2019 |
| CN | 109920818 A | 6/2019 |
| CN | 110164920 A | 8/2019 |
| CN | 110212113 A | 9/2019 |
| CN | 110660931 A | 1/2020 |
| CN | 110767090 A | 2/2020 |
| CN | 111341210 A | 6/2020 |
| WO | 2020098204 A1 | 5/2020 |

\* cited by examiner

STRETCHABLE DISPLAY PANEL AND METHOD FOR MANUFACTURING STRETCHABLE DISPLAY PANEL

CROSS-REFERENCE TO RELATED APPLICATION

This application is a 371 of PCT Patent Application Serial No. PCT/CN2021/070524, filed on Jan. 6, 2021, which claims priority of the Chinese Patent Application No. 202010275063.3, filed on Apr. 9, 2020 and entitled "DISPLAY PANEL, DISPLAY DEVICE AND METHOD FOR MANUFACTURING DISPLAY PANEL", the contents of both of which are herein incorporated by reference in its entirety.

TECHNICAL FIELD

The present disclosure relates to the field of display technologies, and more particularly to a display panel, a display device and a method for manufacturing a display panel.

BACKGROUND

In the field of flexible display technologies, most of existing stretchable display panels use a design adopting many perforated structures, and the perforated structures cause a relatively high risk to the packaging of a display panel. For example, the packaging for inner side walls of the perforated structures is relatively weak, and may easily fail in a stretching process. In addition, a packaging layer may be easily ruptured when a flexible display panel is stripped from a glass substrate.

SUMMARY

The present disclosure provides a display panel, a display device and a method for manufacturing a display panel.

According to an aspect, a display panel is provided. The display panel includes:
a base, wherein the base includes a plurality of island regions and at least one perforated region, and each perforated region has an opening that penetrate through the base; and
pixel units disposed in the island regions, and an elastic filling layer disposed in the perforated region.

In some embodiments, a thickness of the elastic filling layer is less than a thickness of the perforated region, and both thickness directions of the elastic filling layer and the perforated region are perpendicular to a bearing surface of the base.

In some embodiments, a thickness of the elastic filling layer is greater than a thickness of the perforated region.

In some embodiments, the elastic filling layer covers the base.

In some embodiments, the materials of the elastic filling layer include organic materials.

In some embodiments, the organic materials may include at least one of the following: polymethyl methacrylate, polydimethylsiloxane, polyurethane, polyphenylene sulfide, silica gel, hexamethyl disiloxane or tetramethylsilane.

In some embodiments, the display panel further includes a first inorganic layer and a second inorganic layer that are sequentially laminated on an inner side wall of the perforated region.

In some embodiments, the display panel further includes an isolation structure disposed between the perforated region and the island regions, and the isolation structure includes an isolation structure body and an isolation structure cover layer which covers the isolation structure body.

In some embodiments, the isolation structure body includes at least one of a pixel definition layer and a flat layer.

In some embodiments, the isolation structure cover layer includes a light emitting layer, an electrode layer, a first inorganic layer and a second inorganic layer that sequentially cover the isolation structure body in a direction being away from the base.

According to another aspect, a display device is provided. The display device includes a display panel provided in each embodiment of the present disclosure, and a drive circuit; and the drive circuit is used to drive the pixel units in the display panel.

According to another aspect, a method for manufacturing a display panel is provided. The method includes:
forming a base, wherein the base includes a plurality of island regions and at least one perforated region, wherein the perforated region has an opening that penetrate through the base;
forming pixel units in the island regions; and
forming an elastic filling layer in the perforated region.

In some embodiments, forming the base includes forming the base on a substrate using a flexible material; and after forming the elastic filling layer in the perforated region, the method further includes: stripping the substrate.

In some embodiments, before forming the elastic filling layer in the perforated region, the method further includes forming openings that penetrate through the base in preset positions among the island regions;
sequentially forming a light emitting layer and an electrode layer on the bottom of the perforated region;
sequentially forming a first inorganic layer and a second inorganic layer on the bottom and the inner side wall of the perforated region; and
stripping the substrate includes: stripping the substrate and stripping the light emitting layer, the electrode layer, the first inorganic layer and the second inorganic layer on the bottom of the perforated region.

A thickness of the elastic filling layer is less than a thickness of the perforated region, and both thickness directions of the elastic filling layer and the perforated region are perpendicular to a bearing surface of the base.

In some embodiments, a thickness of the elastic filling layer is greater than a thickness of the perforated region, and both the thickness directions of the elastic filling layer and the perforated region are perpendicular to the bearing surface of the base.

In some embodiments, the elastic filling layer covers the base.

In some embodiments, the method further includes:
forming an isolation structure between the perforated region and the island regions, and the isolation structure includes an isolation structure body and an isolation structure cover layer which covers the isolation structure body.

In some embodiments, the isolation structure body includes at least one of a pixel definition layer and a flat layer; and the isolation structure cover layer includes a light emitting layer, an electrode layer, a first inorganic layer and a second inorganic layer that sequentially cover the isolation structure body in a direction being away from the base.

BRIEF DESCRIPTION OF THE DRAWINGS

Other features, purposes and advantages of the present disclosure will be more apparent through reading the following detailed description to non-limiting embodiments with reference to the accompanying drawings.

DETAILED DESCRIPTION

The present disclosure will be described in further details with reference to accompanying drawings and embodiments. It should be understood that the above embodiments are merely for the purpose of explanation, and are not intended to limit the present disclosure. In addition, it needs to be explained that to facilitate the description, only the part related to the present invention is shown in the accompanying drawings.

Unless otherwise defined, the technical terms or scientific terms used in the present disclosure shall be of general meanings as understood by those of ordinary skill in the art to which the present disclosure pertains. The terms "first", "second" and similar terms used in the present disclosure do not denote any order, quantity, or importance, and are merely used to distinguish different components. The term "comprising" or "having" or similar terms mean that the elements or items which appear before the term include the elements or items or their equivalents listed after the term, and do not exclude other elements or items. The term "connect" or "connected with each other" or the like is not limited to a physical connection or a mechanical connection, and it may comprise an electrical connection, regardless of a direct connection or an indirect connection. The terms "upper", "lower", "left", "right" and the like are only used to indicate relative position relations, and the relative positions may be changed correspondingly when the absolute position of a described object is changed.

It should be understood that in the case of no conflict, the features in the above embodiments of the present disclosure can be combined with each other. The present disclosure will be described in details hereinafter with reference to the accompanying drawings and in combination with the embodiments.

Figure 1:
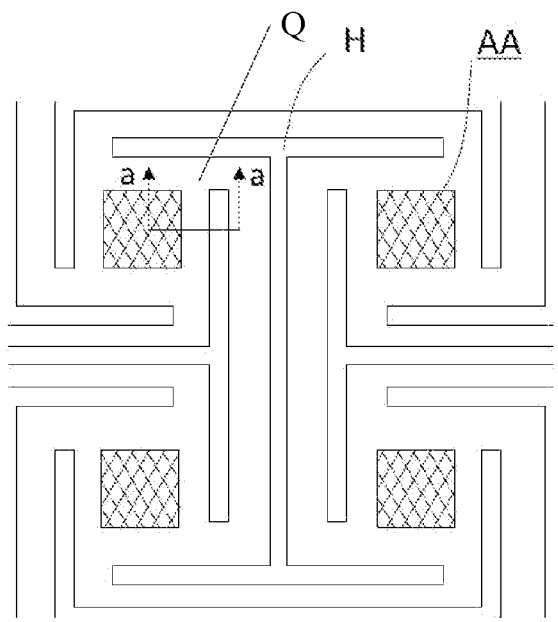
FIG. 1 illustrates a block diagram of an exemplary structure of a display panel according to an embodiment of the present disclosure.

The inventor noticed that in the field of flexible display technologies, the stretchable display panel as shown in FIG. 1 mostly uses many perforated regions H. The perforated regions H may ensure the performances of stretching and bending of the display panel, while also render a relatively large risk to the packaging of the display panel. For example, the packaging of the side walls of the perforated regions H is relatively weak and may easily fail in a stretching process. In addition, a packaging layer may be easily ruptured when a flexible display panel is stripped from a glass substrate.

Embodiments of the present disclosure provide the following technical solutions, which may solve the above technical problem.

Figure 2:
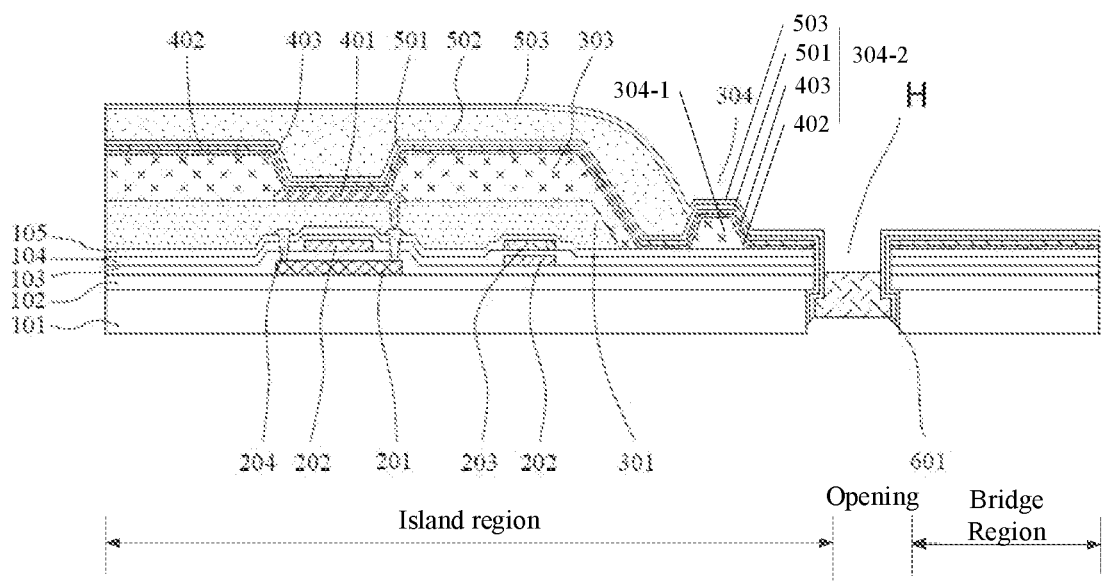
FIG. 2 illustrates a sectional diagram of a line a-a of the display panel of FIG. 1.

Referring to FIG. 1 and FIG. 2, FIG. 1 illustrates a top diagram of the display panel according to an embodiment of the present disclosure. FIG. 2 illustrates a sectional diagram of line a-a of the disclosure illustrated in FIG. 1. From FIG. 1 and FIG. 2, it can be seen that the display panel provided by the embodiments of the present disclosure includes:

a base 101, wherein the base has a plurality of island regions AA and at least one perforated region H, and each perforated region H has an opening that penetrate through the base. For example, referring to FIG. 1, adjacent island regions AA may be connected with each other through a bridge region Q; and a plurality of perforated regions H that penetrate through the base are distributed at preset positions within the bridge region Q.

The display panel further includes pixel units disposed in the island regions AA and an elastic filling layer 601 disposed in the perforated region H. In each island region AA, one or multiple pixel units may be provided.

The structure of the display panel as shown in FIG. 1 is only an exemplary embodiment and is not a unique definition, and the specific structure may be determined according to actual requirements. As shown in FIG. 1, the display panel includes a plurality of island regions AA, and adjacent island regions AA may be connected with each other through a bridge region Q. The island regions AA include pixel units (which may also be called a display unit), and the bridge region Q is used for routing lines. A plurality of perforated regions H are distributed at the preset positions within the bridge region Q. The perforated regions H are positions where the openings are disposed, and the existing of openings increases a stretching range and a bending degree of the display panel, i.e., the display panel provided by the embodiments of the present disclosure is a flexible display panel.

It should be understood that a packaging layer is further formed on the inner side walls of the perforated regions H, and a material of the packaging layer is an inorganic material. Since the packaging layer formed on the inner side walls of the perforated regions H usually is relatively thin, and the stretching performance of the packaging layer is relatively poor, then the packaging layer may easily fail in the processes of stretching and bending of the display panel. As shown in FIG. 2, according to the present technical solution, an elastic filling layer 601 which is formed by elastic materials is disposed in the perforated regions H, and may have a reinforcement function for the packaging layer, and thus, the probability of failure of the packaging layer is effectively reduced in the processes of stretching and bending of the display panel, and a packaging reliability for the side walls of the perforated regions is improved. In addition, since the elastic filling layer 601 is made of elastic materials, it may not affect the performances of stretching and bending of the display panel.

It should also be understood that in a process of manufacturing the display panel, a base and respective film layers (including a packaging layer disposed on the inner side walls and the bottom of the perforated regions H) need to be formed firstly on a glass substrate, and then the glass substrate is stripped from the base. However, in the stripping process, the packaging layer disposed on the bottom of the perforated regions H need to be stripped at the same time, and this easily results in a rupture of the packaging layer of the inner side walls within the perforated regions H. In the embodiments of the present disclosure, however, after the elastic filling layer 601 is disposed in the perforated regions H, it may form a squeezing force on the inner side walls of the perforated regions H. The force may solve the technical problem of the rupture of the packaging layer when the flexible display panel is stripped from the glass substrate.

Optionally, the elastic materials for forming the elastic filling layer 601 may further include organic materials. For example, the organic materials may include at least one of the following: polymethyl methacrylate (PMMA), polydimethylsiloxane (PDMS), polyurethane (PU) or polyphenylene sulfide (PPS) or the like; or, they may include at least one of the following organic silicon compound materials: silica gel, hexamethyl disiloxane (HMDSO) or tetramethylsilane (TMS) or the like.

As shown in FIG. 2, in some embodiments, a thickness (which may also be called a height) of the elastic filling layer 601 may be less than a thickness of the perforated region H. And both thickness directions of the elastic filling layer 601 and the perforated regions H are perpendicular to a bearing surface of the base 101. That is, in the embodiment, the elastic filling layer 601 may be completely disposed within the openings of the perforated region H.

Figure 3:
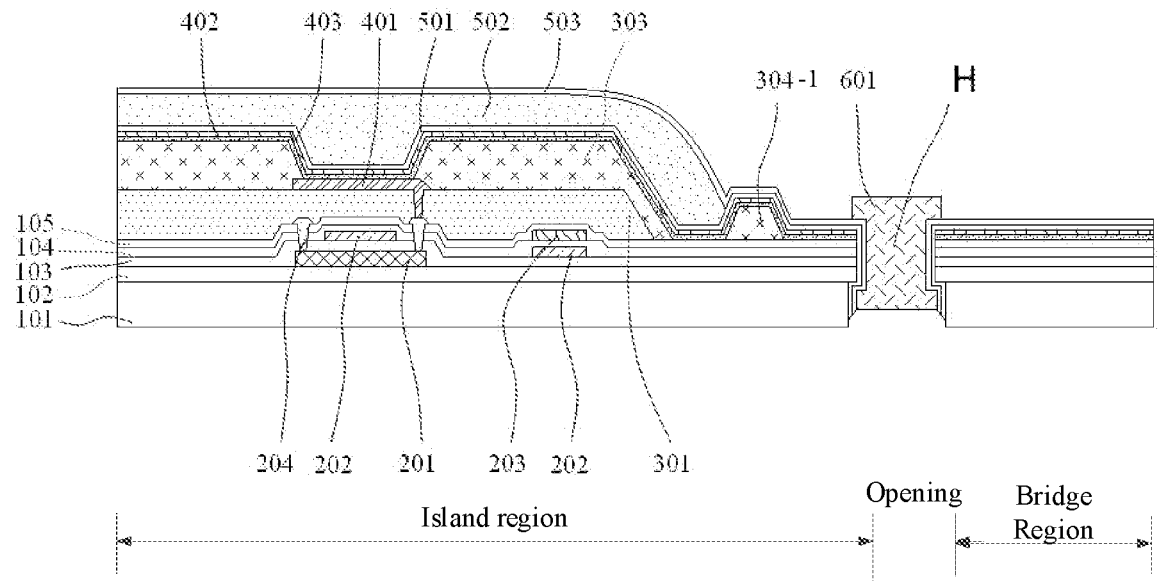
FIG. 3 illustrates a block diagram of an exemplary structure of a display panel according to another embodiment of the present disclosure.

As shown in FIG. 3, in some embodiments, a thickness of the elastic filling layer 601 may be greater than a thickness of the perforated region H. That is, a part of the elastic filling layer 601 is disposed within the openings of the perforated region H, while another part is disposed outside the openings. Compared with the display panel as shown in FIG. 2, the difference of the display panel as shown in FIG. 3 is that the thickness of the elastic filling layer 601 is increased, such that a range of an inorganic layer (i.e., the packaging layer formed by the inorganic materials) which may be protected by the elastic filling layer 601 is increased.

Figure 4:
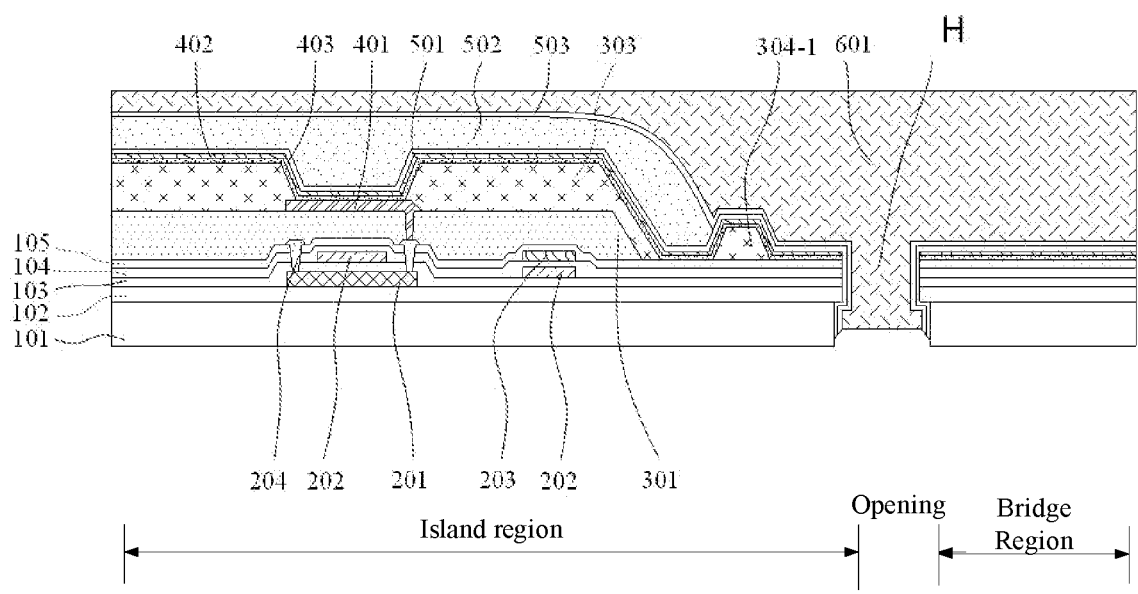
FIG. 4 illustrates a block diagram of an exemplary structure of a display panel according to another embodiment of the present disclosure.

As shown in FIG. 4, in some embodiments, the entirety of the elastic filling layer 601 may cover the entire base 101, that is, an orthographic projection of the elastic filling layer 601 on the base 101 may cover each island region AA, each perforated region H and each bridge region Q. Compared with the display panel as shown in FIG. 3, the difference of the display panel as shown in FIG. 4 is that the thickness and the covering range of the elastic filling layer 601 are different. In the embodiment, the elastic filling layer 601 may not only protect the inorganic layer of the perforated regions H, but also prevent the film layers of the entire base 101 from being damaged by foreign matters.

The thicknesses and covering ranges of the above several elastic filling layers 601 are selected according to application scenes, and are not defined herein.

Optionally, as shown in FIG. 2, the display panel may further include an isolation structure 304 (which may also be called a barrier structure, or a blocking dam) disposed between a perforated region H and an island region AA, and the isolation structure 304 includes an isolation structure body 304-1 and an isolation structure cover layer 304-2 which covers the isolation structure body 304-1. The isolation structure 304 may prevent water vapor and oxygen around the perforated region H from entering the island region AA, so as to reduce negative effects caused to the performance of the pixel units, and thus improve the display effect of the display panel.

In some embodiments, the isolation structure body 304-1 includes a pixel definition layer 303. As shown in FIG. 2, the isolation structure body 304-1 is composed of a part of the pixel definition layer 303. In the process of manufacturing the pixel definition layer 303, the isolation structure body 304-1 may be acquired by patterning the pixel definition layer 303.

Or, the isolation structure body 304-1 may include a flat layer 301, i.e., the isolation structure body 304-1 is composed of a part of the flat layer 301. When the flat layer 301 is manufactured, the isolation structure body 304-1 may be acquired by patterning the flat layer 301.

Or, the isolation structure body 304-1 may include the flat layer 301 and the pixel definition layer 303 that are sequentially laminated. That is, the isolation structure body 304-1 is composed of a part of the flat layer 301 and a part of the pixel definition layer 303.

In some embodiments, the isolation structure cover layer 304-2 includes a light emitting layer 401, an electrode layer 403, a first inorganic layer 501 and a second inorganic layer 503 that sequentially cover the isolation structure body 304-1 in a direction from being proximal to the base 101 to being distal from the base 101 (the direction from bottom to top in the figure). The electrode layer 403 may be an anode layer or a cathode layer, which is not defined herein. Description will be made in the following by taking the example that the electrode layer 403 is the cathode layer.

An implementation method of the display panel provided by the embodiments of the present disclosure will be introduced in combination with FIG. 5 to FIG. 10 in the following.

Figure 5:
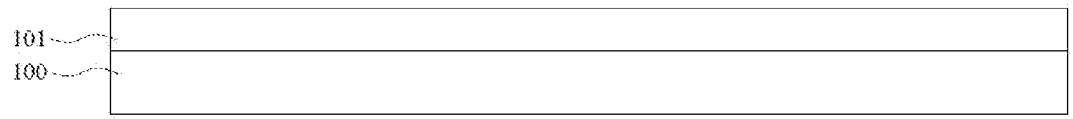
FIG. 5 to FIG. 10 illustrate an exemplary schematic diagram of a manufacturing process of the display panel as illustrated in FIG. 2.

As shown in FIG. 5, the base 101 may be disposed on a substrate 100, and the substrate 100 may be a glass substrate. The base 101 may be a flexible base, and a material of the flexible base may be polyimide, such that a display device may be curved, bent or stretched.

Figure 6:
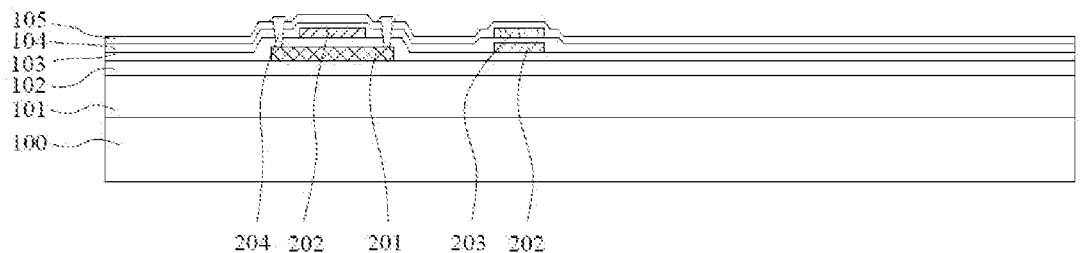

As shown in FIG. 6, the display panel may further include a buffer layer 102, a first insulating layer 103, a second insulating layer 104, an intermediate layer 105 and a thin film transistor that are sequentially laminated on the base 101. The thin film transistor includes an active layer 201, a gate electrode 202, an electrode 203, and a source/drain electrode 204. The electrode 203 and the gate electrode 202 may form a capacitance.

Figure 7:
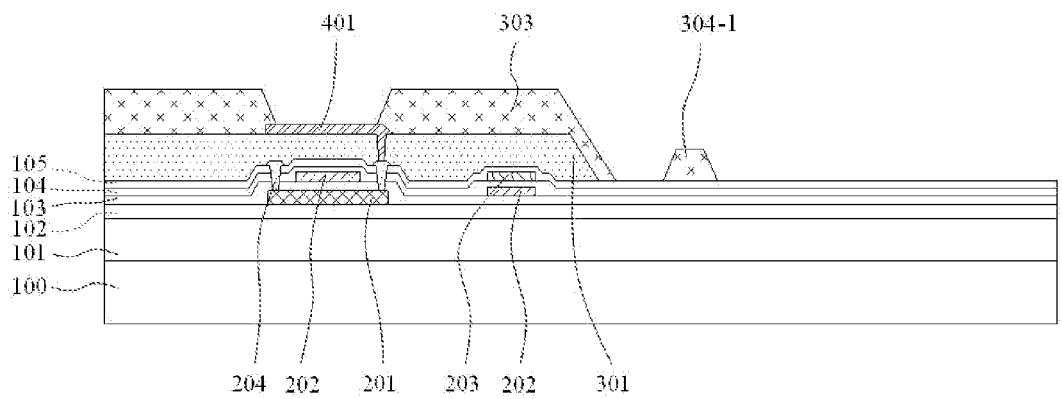

As shown in FIG. 7, the display panel may further include a flat layer 301, an anode 401 and a pixel definition layer 303 that are sequentially laminated on the intermediate layer 105. When the flat layer 301 and/or the pixel definition layer 303 are formed, an isolation structure body 304-1 may be formed by patterning the flat layer 301 and/or the pixel definition layer 303.

Figure 8:
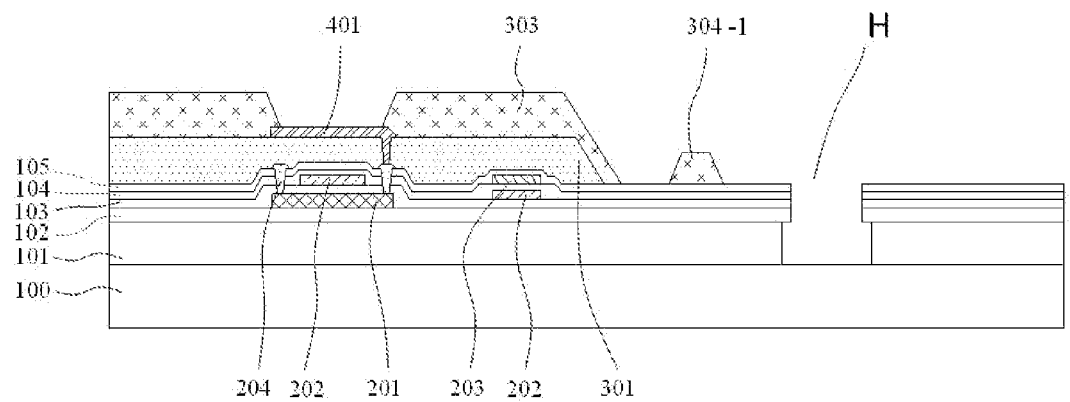

As shown in FIG. 8, the openings of the perforated region H of the base 101 may sequentially penetrate through the intermediate layer 105, the second insulating layer 104, the first insulating layer 103, the buffer layer 102 and the base 101.

Figure 9:
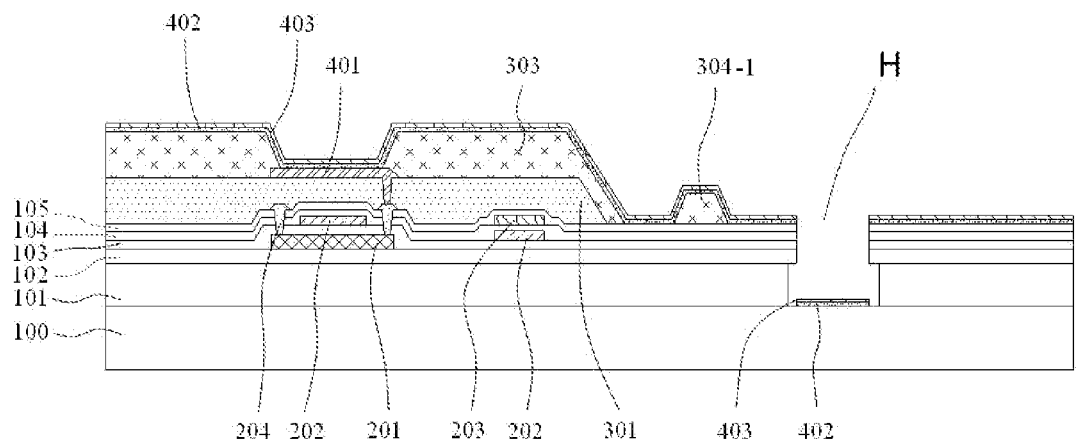

As shown in FIG. 9, the display panel may further include a light emitting layer 402 and an electrode layer 403 (cathode) that are sequentially laminated on a pixel definition layer 303. And the light emitting layer 402 and the cathode 403 cover the isolation structure body 304-1 to form a part of the isolation structure cover layer 304-2.

Figure 10:
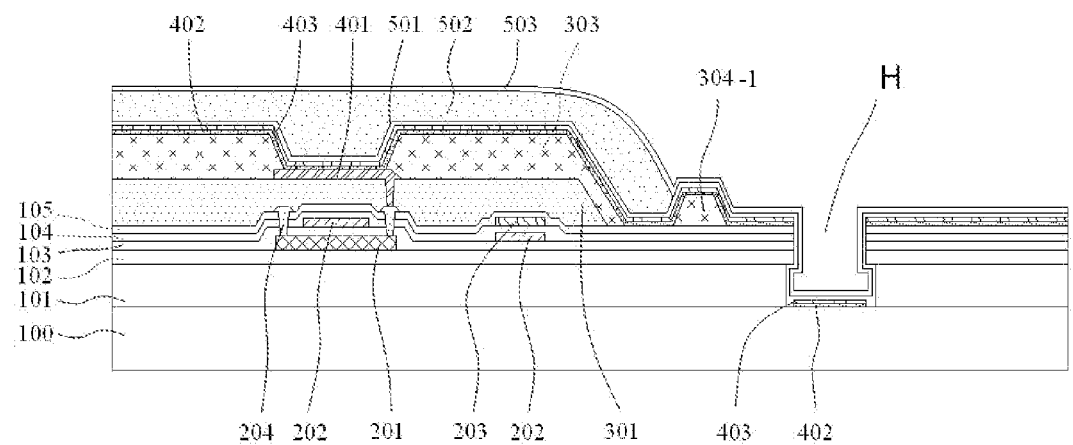

As shown in FIG. 10, the display panel further includes a first inorganic layer 501, an organic layer 502 and a second inorganic layer 503 that are sequentially laminated on an electrode layer 403 (cathode). The first inorganic layer 501, the organic layer 502 and the second inorganic layer 503 realize a packaging of the display panel. The organic layer 502 is isolated by an isolation structure 304 and thus does not cover the entire isolation structure body 304-1. The entire layers of the first inorganic layer 501 and the second inorganic layer 503 cover a base 101, and thus, as shown in FIG. 10, the first inorganic layer 501 and the second inorganic layer 503 are also sequentially laminated on the inner side walls of the perforated region H.

In addition, from FIG. 10, it can be seen that the isolation structure cover layer 304-2 further includes the first inorganic layer 501 and the second inorganic layer 503 that are sequentially laminated on the electrode layer 403 (cathode).

FIG. 8 shows steps of a process for forming the openings, and it is not introduced herein, and reference can be made to the following detailed description in the embodiment of the manufacturing method in the following text.

Figure 11:
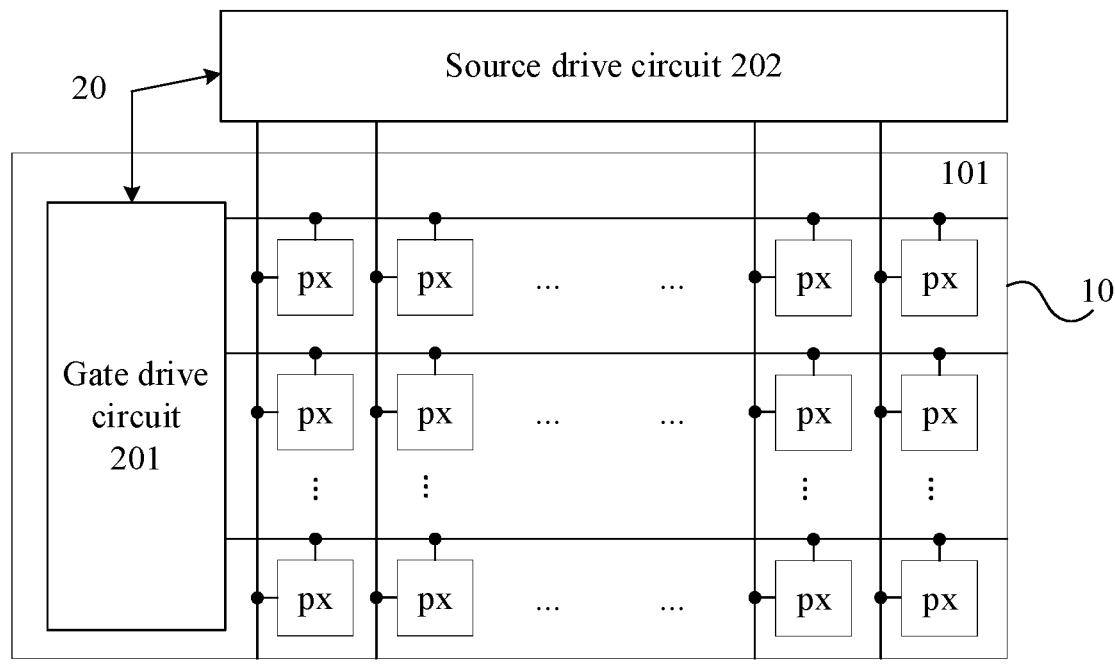
FIG. 11 illustrates a block diagram of an exemplary structure of a display device according to an embodiment of the present disclosure.

According to the embodiments of the present disclosure, a display device is provided. As shown in FIG. 11, the display device may include a display panel 10 provided in the above embodiments of the present disclosure, and a drive circuit 20 used for driving the pixel units in the display panel 10.

Optionally, as shown in FIG. 11, the drive circuit 20 may include a gate drive circuit 201 and a source drive circuit 202. The source drive circuit 202 is used to provide data signals for each column of pixel units px. The gate drive circuit 201 is used to provide gate drive signals for each row of pixel units px. Each pixel unit px may emit light driven by the gate drive signals and the data signals.

In some embodiments, the gate drive circuit 201 may be disposed on a base 101 of the display panel 10. That is, the gate drive circuit 201 may be a gate driver on array (GOA) circuit.

Figure 12:
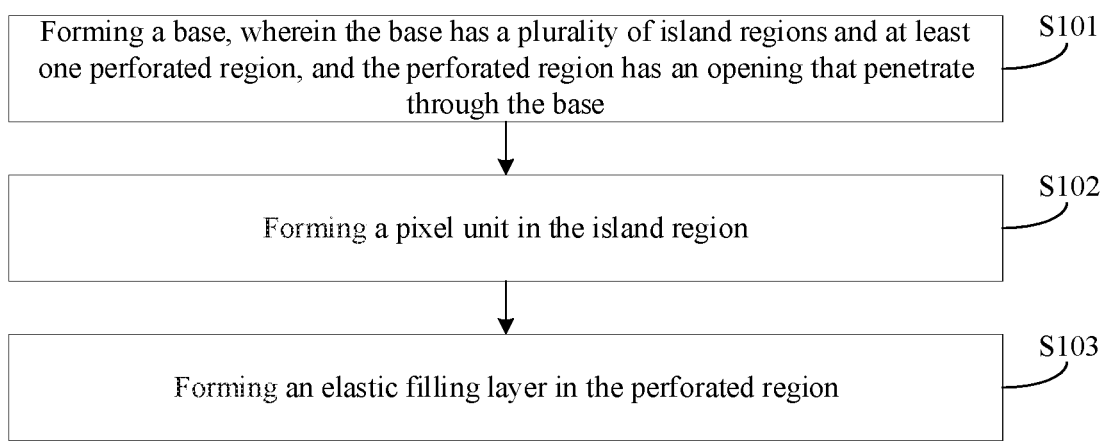
FIG. 12 illustrates an exemplary flow chart of a method for manufacturing a display panel according to an embodiment of the present disclosure.

According to the present disclosure, a method for manufacturing a display panel is further provided. The method is used to manufacture the display panel provided by the above embodiments. As shown in FIG. 12, the manufacturing method includes:

in S101, a base is formed, wherein the base has a plurality of island regions and at least one perforated region, and the perforated region has an opening that penetrate through the base.

Adjacent island regions may be connected with each other through a bridge region; at least one perforated region is disposed within the bridge region, and said each perforated region has an opening that penetrate through the base.

In S102, a pixel unit is formed in the island region.

In the embodiments of the present disclosure, one or multiple pixel units may be formed in said each island region.

In S103, an elastic filling layer is formed in the perforated region.

The elastic filling layer may be formed by an elastic material, and the elastic material may be an organic material.

Figure 13:
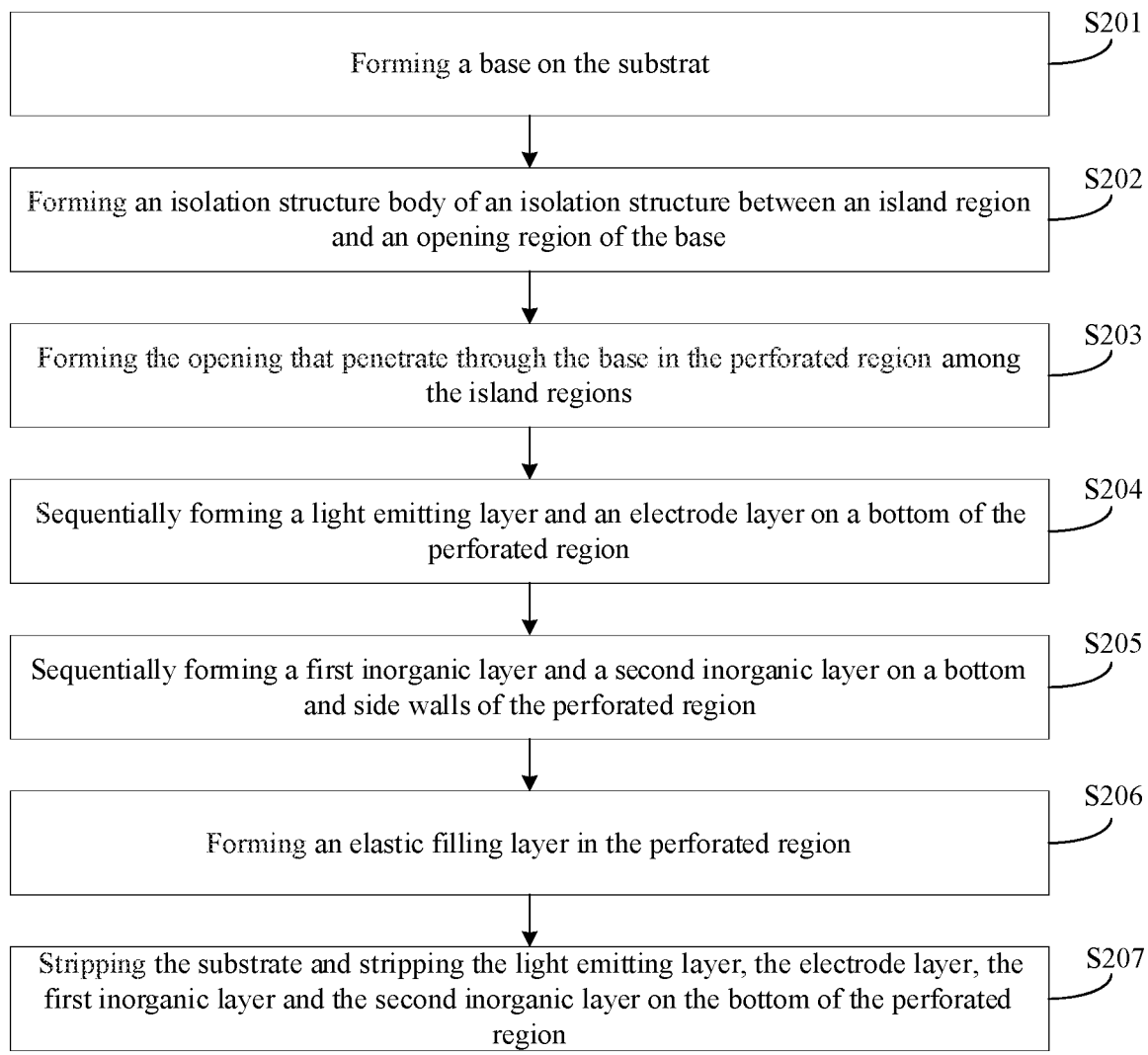
FIG. 13 illustrates an exemplary flow charge of a method for manufacturing a display panel according to another embodiment of the present disclosure.

A manufacturing process of the display panel will be described hereinafter in combination with FIG. 5 to FIG. 10, and referring to FIG. 13, the manufacturing process includes the following steps.

In S201, a base is formed on the substrate.

As shown in FIG. 5, a base 101 is formed on the substrate 100, and the substrate 100 may be a glass substrate. The base 101 is a flexible base, and a material of the flexible base may be polyimide, such that the display device may be curved, bent or stretched.

In S202, an isolation structure body of an isolation structure is formed between an island region and an opening region of the base.

As shown in FIG. 6, before forming the isolation structure body, a buffer layer 102, a first insulating layer 103, a second insulating layer 104, an intermediate layer 105 and a thin film transistor (TFT) are sequentially formed on the base 101, wherein the TFT includes an active layer 201, a gate electrode 202, an electrode 203 and a source/drain electrode 204.

As shown in FIG. 7, after the TFT is formed, a flat layer 301, an anode 401 and a pixel definition layer 303 are further sequentially formed on the intermediate layer 105. The anode 401 is connected with the source/drain electrode 204 of the TFT through via-holes in the flat layer 301.

Optionally, when the pixel definition layer 303 is formed, patterns of an isolation structure body 304-1 may be formed by patterning the pixel definition layer 303. And/or, when the flat layer 301 is formed, patterns of the isolation structure body 304-1 may be formed through patterning the flat layer 301.

In S203, openings that penetrate through the base are formed in the perforated region among the island regions.

As shown in FIG. 8, before the light emitting layer 402 of the island regions AA is formed, at least one opening that penetrates through the base 101 may be formed at a preset position within a bridge region Q between two adjacent island regions AA, and the region where said each opening is disposed is a perforated region H. Optionally, the openings may be formed by a photoetching technology.

Referring to FIG. 8, it can be seen that the openings in the perforated region H also sequentially penetrate through the intermediate layer 105, the second insulating layer 104, the first insulating layer 103 and the buffer layer 102.

In S204, a light emitting layer and an electrode layer are sequentially formed on a bottom of the perforated region.

As shown in FIG. 9, a light emitting layer 402 and an electrode layer 403 may be sequentially formed on a pixel definition layer 303, and the electrode layer 403 may be a cathode. The light emitting layer 402 and the cathode 403 are disconnected in the perforated region H, and cover the bottom of the perforated region H. That is, a part of the light emitting layer 402 and a part of the electrode layer 403 (cathode) are directly formed on the base 101 and disposed within the openings.

In S205, a first inorganic layer and a second inorganic layer are sequentially formed on a bottom and side walls of the perforated region.

As shown in FIG. 10, a first inorganic layer 501, an organic layer 502 and a second inorganic layer 503 may be sequentially formed on the electrode layer 403 (cathode), and thus the packaging of the display panel is achieved. The first inorganic layer 501 and the second inorganic layer 503 cover the inner side walls and the bottom of the perforated region H.

In addition, referring to FIG. 9 and FIG. 10, it can be seen that a part of the first inorganic layer 501 which is disposed on the bottom of the perforated region H may directly contact the base 100, because the light emitting layer 402 and the cathode 403 within the openings do not completely cover the bottom of the perforated region H.

In the embodiments of the present disclosure, parts of the light emitting layer 402, the cathode 403, the first inorganic layer 501 and the second inorganic layer 503 which cover the isolation structure body 304-1 may constitute the isolation structure cover layer 304-2. That is, the isolation structure cover layer 304-2 may include the light emitting layer 402, the cathode 403, the first inorganic layer 501 and the second inorganic layer 503 that sequentially cover the isolation structure body 304-1 in a direction distal from the base 101.

It should be understood that the TFT, the anode 401, the light emitting layer 402 and the cathode 403 on the base 101 may constitute a pixel unit. Correspondingly, from the description of the above S202 to S205, it can be seen that the openings in the perforated region H and an isolation structure 304 between the island region AA and the perforated region H may be formed at the same time in the process of forming the pixel unit in the island region AA.

In S206, an elastic filling layer is formed in the perforated region.

Figure 14:
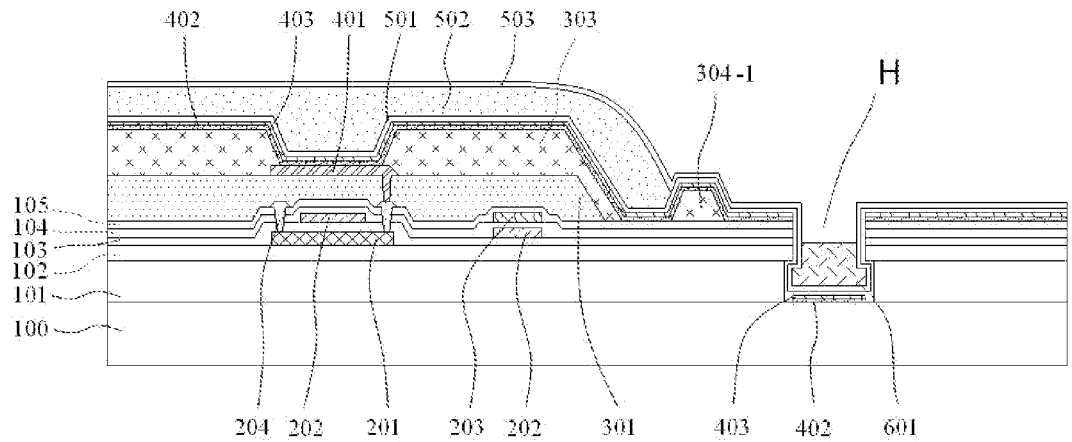
FIG. 14 illustrates an exemplary schematic diagram of the manufacturing process of the display panel as illustrated in FIG. 2.

As shown in FIG. 14, an elastic filling layer 601 is formed on the second inorganic layer 503 of the perforated region H by using a screen printing method or an inkjet printing method. Or, the elastic filling layer 601 may also be acquired by coating the entire surface with an elastic material firstly and then using a photoetching process.

For example, referring to FIG. 2 and FIG. 14, a thickness of the elastic filling layer 601 may be less than a thickness of the perforated region H. Or, referring to FIG. 3, the elastic filling layer 601 has a thickness which may be greater than a thickness of the perforated region H, and only covers a part of the base 101. Or, referring to FIG. 4, the elastic filling layer 601 has a thickness which may be greater than a thickness of the perforated region H and covers the entire layer of the base 101.

In S207, the substrate is stripped, and the light emitting layer, the electrode layer, the first inorganic layer and the second inorganic layer on the bottom of the perforated region are also stripped.

As shown in FIG. 2, the substrate 100 and the base 101 may be stripped by using a laser process, and at the same time, the light emitting layer 402, the cathode 403, the first inorganic layer 501 and the second inorganic layer 503 disposed on the bottom of the perforated region H are stripped; while the elastic filling layer 601, the first inorganic layer 501 and the second inorganic layer 503 on the inner side walls of the perforated region H may be remained.

In the stripping process, the first inorganic layer 501 and the second inorganic layer 503 on the inner side walls of the perforated region H may be easily ruptured with the stripping of the film layers on the bottom. In the embodiments of the present disclosure, after the elastic filling layer 601 is disposed on the perforated region H, the elastic filling layer 601 may form a squeezing force on the inner side walls of the perforated region H. The force may prevent the first inorganic layer 501 and the second inorganic layer 503 from being ruptured with the stripping of the film layers on the bottom of the perforated region H, thereby increasing the packaging strength of the side walls of the perforated region H, and the stretching performance of the display panel is not affected.

In addition, the elastic filling layer 601 may also reinforce inorganic layers on the inner side walls, thereby effectively decreasing the failure probability of the inorganic layer in the processes of stretching and bending of the display panel, and this improves the packaging reliability of the side walls of the perforated region. In addition, since the elastic filling layer 601 is made of an elastic material, it will not affect the performances of the stretching and bending of the display panel.

It should be understood that the term "at least one" as mentioned in the embodiments of the present disclosure indicates one or multiple, and multiple indicates two or more.

It should also be understood that the term "and/or" mentioned in the present disclosure instructing three kinds of relationships. For example, A and/or B may indicate that A exists alone, A and B exist concurrently, B exists alone. In addition, the character "/" in the present disclosure generally instructs that the objects preceding and following the character is an "OR" relationship.

Described above are merely exemplary embodiments of the present disclosure and explanations to the principles of the used technologies. A person skilled in the art should understood that the protection scope of the present disclosure is not limited to the above technical solutions composed of the specific combinations of the above technical features, and should also include any other technical solution composed of any combination of the above technical features or equivalent technical features without departing from the inventive concept of the present disclosure. For example, a technical solution formed by replacing the above technical features with technical features having the similar function as disclosed in the present disclosure (but not limited to the present disclosure).

The invention claimed is:

1. A stretchable display panel, comprising:
a base, wherein the base comprises a plurality of island regions and at least one perforated region, and each perforated region has an opening that penetrates through the base;
pixels units disposed in the island regions; and
an elastic filling layer disposed in each of the at least one perforated region;
wherein a thickness of the elastic filling layer is greater than a thickness of the perforated region, both thickness directions of the elastic filling layer and the perforated region are perpendicular to a bearing surface of the base, and an orthographic projection of the elastic filling layer on the base completely covers the base.

2. The stretchable display panel according to claim 1, wherein a material of the elastic filling layer comprises an organic material.

3. The stretchable display panel according to claim 2, wherein the organic material comprises at least one of the following: polymethyl methacrylate, polydimethylsiloxane, polyurethane, polyphenylene sulfide, silica gel, hexamethyl disiloxane or tetramethylsilane.

4. The stretchable display panel according to claim 1, wherein the stretchable display panel further comprises a first inorganic layer and a second inorganic layer that are sequentially laminated on an inner side wall of the perforated region.

5. The stretchable display panel according to claim 1, wherein the stretchable display panel further comprises an isolation structure disposed between the perforated region and the island regions, and the isolation structure comprises an isolation structure body and an isolation structure cover layer which covers the isolation structure body.

6. The stretchable display panel according to claim 5, wherein the isolation structure body comprises at least one of a pixel definition layer and a flat layer.

7. The stretchable display panel according to claim 5, wherein the isolation structure cover layer comprises a light emitting layer, an electrode layer, a first inorganic layer and a second inorganic layer that sequentially cover the isolation structure body in a direction being away from the base.

8. The stretchable display panel according to claim 1, wherein the base is a flexible base.

9. A display device, comprising: a drive circuit, and the stretchable display panel according to claim 1, wherein the drive circuit is used to drive the pixel units in the stretchable display panel.

10. The stretchable display panel according to claim 1, further comprising: a buffer layer, a first insulating layer, a second insulating layer, an intermediate layer and a thin film transistor that are sequentially laminated on the base; wherein the thin film transistor comprises an active layer, a gate electrode, an electrode, and a source/drain electrode, the electrode and the gate electrode forming a capacitance.

11. The stretchable display panel according to claim 10, further comprising: a flat layer, an anode and a pixel definition layer that are sequentially laminated on the intermediate layer; wherein the opening of the perforated region sequentially penetrates through the intermediate layer, the second insulating layer, the first insulating layer, the buffer layer, and the base.

12. The stretchable display panel according to claim 11, further comprising: a light emitting layer and an electrode layer that are sequentially laminated on the pixel definition layer, and further comprising: a first inorganic layer, an organic layer, and a second inorganic layer that are sequentially laminated on the electrode layer.

13. A method for manufacturing a stretchable display panel, comprising:
    forming a base, wherein the base comprises a plurality of island regions and at least one perforated region, and each perforated region has an opening that penetrates through the base;
    forming pixel units in the island regions; and
    forming an elastic filling layer in each of the at least one perforated region;
    wherein a thickness of the elastic filling layer is greater than a thickness of the perforated region, both thickness directions of the elastic filling layer and the perforated region are perpendicular to a bearing surface of the base, and an orthographic projection of the elastic filling layer on the base completely covers the base.

14. The method according to claim 13, wherein forming the base comprises forming the base on a substrate using a flexible material; and
    after forming the elastic filling layer in each of the at least one perforated region, the method further comprises: stripping the substrate.

15. The method according to claim 14, wherein before forming the elastic filling layer in the perforated region, the method further comprises:
    forming the opening that penetrates through the base in the perforated region among the island regions;
    sequentially forming a light emitting layer and an electrode layer on the bottom of the perforated region; and
    sequentially forming a first inorganic layer and a second inorganic layer on the bottom and the inner side wall of the perforated region; and
    stripping the substrate comprises: stripping the substrate and stripping the light emitting layer, the electrode layer, the first inorganic layer and the second inorganic layer on the bottom of the perforated region.

16. The method according to claim 13, wherein the method further comprises:
    forming an isolation structure between the perforated region and the island regions, wherein the isolation structure comprises an isolation structure body and an isolation structure cover layer which covers the isolation structure body.

17. The method according to claim 16, wherein the isolation structure body comprises at least one of a pixel definition layer and a flat layer; the isolation structure cover layer comprises a light emitting layer, an electrode layer, a first inorganic layer and a second inorganic layer that sequentially cover the isolation structure body in a direction being away from the base.

* * * * *